United States Patent [19]

Rockley et al.

[11] 4,348,428

[45] Sep. 7, 1982

[54] METHOD OF DEPOSITING DOPED AMORPHOUS SEMICONDUCTOR ON A SUBSTRATE

[75] Inventors: Mark G. Rockley; Gilbert J. Mains, both of Stillwater, Okla.

[73] Assignee: Board of Regents for Oklahoma Agriculture and Mechanical Colleges acting for and on behalf of Oklahoma State University of Agriculture and Applied Sciences, Stillwater, Okla.

[21] Appl. No.: 216,087

[22] Filed: Dec. 15, 1980

[51] Int. Cl.³ .............................................. C23C 17/02
[52] U.S. Cl. ...................................... 427/54.1; 427/85; 427/86
[58] Field of Search ....................... 427/53.1, 54.1, 85, 427/86; 423/348, 349; 204/157.1 R, 157.1 H, DIG. 11

[56] References Cited

U.S. PATENT DOCUMENTS

| | | | |
|---|---|---|---|
| 3,271,180 | 9/1966 | White | 204/159.22 |
| 3,620,827 | 11/1971 | Cooleg | 427/54.1 |
| 3,661,637 | 5/1972 | Sirtl | 427/53.1 |
| 4,181,751 | 1/1980 | Hall et al. | 427/54.1 |
| 4,200,473 | 4/1980 | Carlson | 427/39 |
| 4,260,649 | 4/1981 | Dension et al. | 427/53.1 |

OTHER PUBLICATIONS

Brodsky et al., "IBM Tech. Disc. Bull.", V. 22, No. 8A, Jan. 1980, pp. 3391-3392.

*Primary Examiner*—John H. Newsome
*Attorney, Agent, or Firm*—Head, Johnson & Stevenson

[57] ABSTRACT

A method of depositing a doped amorphous semiconductor on a base material including the steps of subjecting the base to an environment including a semiconductor gas such as silane or germane, a dopant gas such as arsine, phosphine, or diborane, and mercury vapor, and exposing the base in such environment to ultraviolet radiation to effect decomposition of the semiconductor and dopant materials onto the base.

11 Claims, 1 Drawing Figure

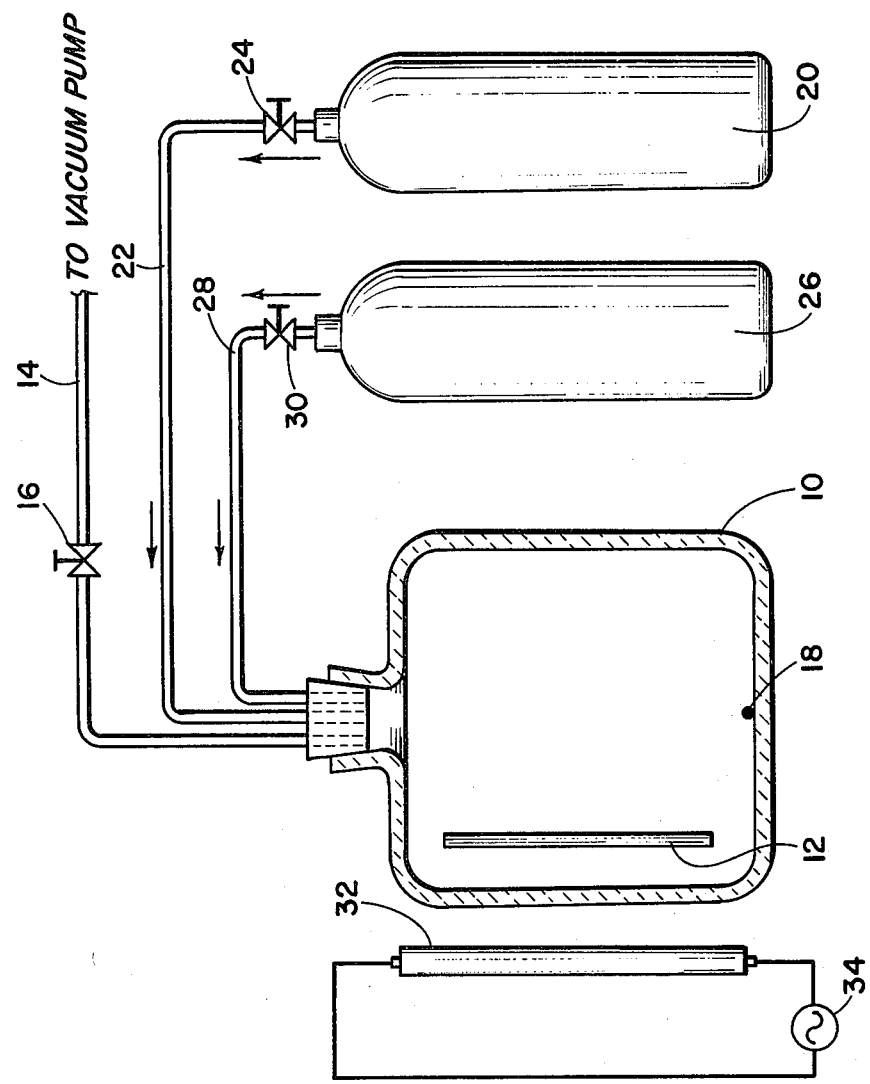

METHOD OF DEPOSITING DOPED AMORPHOUS SEMICONDUCTOR ON A SUBSTRATE

BACKGROUND OF THE INVENTION

1. Field of the Invention

This invention relates to a method of depositing a doped semiconductor onto a base material. The method is applicable to the manufacture of photovoltaic cells and semiconductor electronic apparatus.

2. Description of the Prior Art

Most semiconductor products in commercial use today, including photovoltaic cells and semiconductor electronic devices, are produced using the crystal form of semiconductor material. It has long been recognized that inexpensive photovoltaic cells, which will be required if large commercial usage of the direct conversion of sunlight to electricity is achieved, will not be possible utilizing the crystal form of semiconductor due to the expense involved and the limitations encountered in the production of crystalized form of such semiconductors. Amorphous semiconductors have found limited commercial application because of the difficulty of incorporating N or P doping agents.

It is an object of the present invention to provide an improved method of utilizing amorphous semiconductor material in a manner wherein it may be deposited onto a base material simultaneously with the deposition of a doping agent.

Another and more specific object of this invention is to provide a method of depositing a doped amorphous semiconductor onto a base in which the semiconductor and dopant are supplied in gas form and are thereby easily controllable and adaptable to mass production techniques.

These general objects as well as other and more specific objects of the invention will be fulfilled in the following description and claims, taken in conjunction with the attached drawings.

SUMMARY OF THE INVENTION

A method is described by which a doped amorphous semiconductor is applied to a base material. The base may include virtually any type of solid material such as metal, glass, or plastic. The base, such as a sheet of metal, to receive the doped semiconductor is placed into a vessel. While the vessel may take many forms, one made of material which readily transmits ultraviolet light is ideal. After the base is positioned, the container is evacuated to a pressure of about $1 \times 10^{-5}$ atmospheres. For the process to function, mercury vapor must permeate the environment within the vessel. This may be achieved by conducting mercury vapor into the vessel after it is evacuated or may be achieved by depositing a small quantity of liquid mercury into the vessel prior to evacuation. After the evacuation is completed to the point where the desired pressure is achieved, a quantity of semiconductor gas is directed into the vessel. The gas may be either silane or germane, depending upon whether a silicon or germanium semiconductor material is required. A dopant gas may be arsine, phosphine, or diborane, according to the type of dopant required—arsine and phosphine providing free electrons and diborane providing holes in the resulting semiconductor material. Next, the base is exposed to ultraviolet radiation to offset decomposition of the semiconductor and dopant materials onto the substrate.

The irradiation is preferably accomplished with a low pressure Hg-Lamp. Further, this is economically and readily achieved by exposure to radiation from commercially available mercury vapor light sources. The depth of deposition of the semiconductor and dopant depends primarily upon the intensity of irradiation and the duration of exposure. The ratio of the dopant to the semiconductor can be controlled by the relative partial pressures of the dopant gas to the semiconductor gas to achieve the required level of doping.

DESCRIPTION OF THE VIEWS

The FIGURE is a diagrammatic representation of an apparatus and method for laboratory practice of the invention, it being understood that in actual commercial practice of the invention the apparatus will have a completely different appearance.

DETAILED DESCRIPTION

Referring to the FIGURE, an exemplified embodiment of a method of practicing the invention is illustrated. A vessel 10 provides means of achieving an environment in which the process is carried out. While the vessel 10 may be non-transparent, for reasons which will be explained subsequently, a preferred arrangement is that the vessel 10 is of material transparent to ultraviolet light of 2537-A. Thus the vessel 10 may be formed of quartz.

Into the vessel 10 is positioned a base material 12 which may be virtually any type of physical object on which it is desirable to deposit a doped semiconductor. The object 12 may be formed of metal, which is preferred in the manufacture of photovoltaic cells. The base 12 may be glass, plastic, or any solid substance, preferably having a smooth surface. The vessel 10 is then closed and a vacuum is supplied by line 14 through valve 16 to evacuate the interior of the vessel. It has been found that evacuation to a pressure of about $1 \times 10^{-5}$ atmospheres is sufficient. The vessel 10 then is charged with three gases, that is, mercury vapor, a semiconductor gas, and a dopant gas. Mercury vapor may be injected into the vessel 10 after it is evacuated, or, an easy way to achieve the desired level of mercury vapor is to deposit a quantity of liquid mercury 18 within the vessel 10 prior to the evacuation, the reduced pressure within the vessel permitting a portion of the liquid metal to vaporize readily. Next, the semiconductor gas from pressurized container 20 is conveyed through line 22 and valve 24 to the interior of the vessel. The semiconductor gas 20 may be either silane or germane. If the semiconductor is to be of silicon, then silane is used, and if of germanium, then germane is used. Next, a dopant gas from vessel 26 is conducted by line 28 through valve 30 into the interior of the vessel 10. The dopant gas 26 may be arsine ($AsH_3$) or phosphine ($PH_3$) if the dopant is to provide free electrons or diborane ($B_2H_6$) if the dopant is to provide holes. The order or sequence of inserting the semiconductor gas and the dopant gas into the vessel is not material—both may be injected simultaneously.

After the prescribed gases are conveyed into the vessel, valves 16, 24, and 30 may be closed. Photolytic decomposition of the semiconductor material and the dopant are achieved by subjecting the base in the environment existing within the vessel to ultraviolet radiation to effect mercury photosensitized decomposition. The ultraviolet radiation, wavelength of 2537A, is readily available from commercially available mercury vapor lights, such as flourescent lights, or the like. In the illustrated arrangement, a flourescent light bulb 32 supplied from an energy 34 which may be normal house current, is employed to provide the required radiation. Obviously any type of apparatus providing the radiation having the wave length of excited mercury vapor will function for the intended results of the invention.

In one demonstration of the invention a thin sheet of metal is placed in a quartz bottle of about 3" in diameter. A small quantity of liquid mercury was placed in the bottle and the bottle evacuated to about $1 \times 10^{-5}$ atmospheres. Silane and phosphine gases were introduced into the bottle to bring the desired degree of pressure within the bottle to about 0.01 atmospheres. The sheet of metal in the bottle was exposed to a fluorescent light spaced about 1" from the exterior wall of the bottle, the light being a commercial type 48" fluorescent tube as customarily utilized in commercial and residential fluorescent lighting but with a fused quartz envelope. The radiation was directed onto the metal plate for about 15 minutes after which the plate was removed from the bottle and the surface of the plate which received the radiation was analyzed by electron spectroscopy for chemical analysis. It was shown that phosphorus was unoxidized and chemically incorporated into the amorphous silicon. Further tests showed that the photochemically deposited silicon film was amorphous and was determined by scanning electron microscopy and by infrared analysis to be spectrometrically equivalent to amorphous silicon film produced by radio frequency discharge methods.

As previously indicated, the amount of doping of the amorphous silicon is related to the ratio of the doping gas to the substrate gas employed. Tests have shown that when a mixture containing 10% mole fraction diborane in an atmosphere otherwise composed essentially of silane, the deposited silicon was found to contain 6.3 atoms percent boron. A similar irradiation of 1.4 moles percent phosphine in silane produced a film of silicon containing 0.4 atoms percent phosphorus.

Exposure of the metal plates produced by the techniques of this invention as above described have demonstrated photovoltaic action.

Another use of the methods of this invention is to close or "heal" imperfections or fractures in a semiconductor material deposited on a base. Irradiation of an imperfect element in the environment described herein can be employed to repair the defects so that the semiconductor covering is solid, that is, without gaps, holes or fractures.

While the invention has been described with a certain degree of particularity, it is manifest that many changes may be made in the details of construction and the arrangement of components along with the sequence of steps employed in practicing the method of the invention without departing from the spirit and scope thereof. The invention is not to be limited by the illustrated embodiment which has been described for purposes of exemplification, but is to be limited only by the scope of the attached claim or claims, including the full range of equivalency of each step thereof.

What is claimed is:

1. A method of depositing a doped amorphous semiconductor on a base member comprising the steps of:
   (a) subjecting the base member to an environment including (1) a semiconductor gas selected from silane and germane, (2) a dopant gas selected from arsine, phosphine and diborane, and (3) mercury vapor; and
   (b) exposing the base member in the environment to ultraviolet radiation to effect mercury photosensitized decomposition of semiconductor and dopant onto the member.

2. The method of claim 1 in which the environment surrounding the base member at the time of irradiation is at a pressure of about 0.01 atmospheres.

3. The method of claim 1 in which the required environment is provided in a closed vessel at least a portion of which is transparent to the required frequency of irradiation and in which the source of irradiation is external of the vessel.

4. The method of claim 2 in which the mercury vapor is obtained by depositing liquid mercury in the environment and subsequently evacuating the environment to a pressure of about $1 \times 10^{-5}$ atmospheres or less.

5. The method of claim 1 in which irradiation is obtained from a mercury vapor source.

6. The method of claim 1 in which irradiation is at a frequency of about 2537A.

7. A method of depositing doped amorphous semiconductor on a base comprising;
   (a) positioning the base in a closed vessel;
   (b) evacuating the closed vessel;
   (c) introducing mercury vapor into the vessel;
   (d) introducing semiconductor gas selected from arsine, phosphine and diborane into the vessel; and
   (e) introducing a dopant gas selected from arsine, phosphine and diborane into the vessel; and
   (f) subjecting the base to ultraviolet radiation to effect mercury photosensitized decomposition of semiconductor and dopant onto the base.

8. The method according to claim 7 in which the pressure within the vessel during step (f) is about 0.01 atmospheres.

9. The method according to claim 7 in which step (c) is accomplished by depositing liquid mercury into the vessel prior to step (b).

10. The method according to claim 7 in which in step (e) the irradiation is accomplished at 2537A.

11. A method of depositing a semi-conductor on a base member comprising the steps of:
   (a) subjecting the base member to an environment including (i) a semiconductor gas obtained as a chemical derivative of a semiconducting material, and (2) mercury vapor; and
   (b) exciting the resulting gas mixture by a light source to effect photosensitized decomposition of the semiconductor onto the base member.

* * * * *